(12) United States Patent
Cook

(10) Patent No.: US 9,620,328 B1
(45) Date of Patent: Apr. 11, 2017

(54) ELECTROSTATIC MULTIPOLE DEVICE, ELECTROSTATIC MULTIPOLE ARRANGEMENT, CHARGED PARTICLE BEAM DEVICE, AND METHOD OF OPERATING AN ELECTROSTATIC MULTIPOLE DEVICE

(71) Applicant: ICT Integrated Circuit Testing Gesellschaft für Halbleiterprüftechnik mbH, Heimstetten (DE)

(72) Inventor: Benjamin John Cook, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/947,568

(22) Filed: Nov. 20, 2015

(51) Int. Cl.
  *H01J 37/00* (2006.01)
  *H01J 37/147* (2006.01)
  *H01J 37/28* (2006.01)

(52) U.S. Cl.
  CPC .......... *H01J 37/1477* (2013.01); *H01J 37/28* (2013.01); *H01J 2237/1516* (2013.01)

(58) Field of Classification Search
  CPC . H01J 37/1477; H01J 37/28; H01J 2237/1516
  USPC ..................................................... 250/396 R
  See application file for complete search history.

(56) References Cited

U.S. PATENT DOCUMENTS 6,563,124 B2 * 5/2003 Veneklasen ............ B82Y 10/00
  250/398
7,875,858 B2 * 1/2011 Ito ......................... H01J 37/145
  250/396 ML
8,933,425 B1 * 1/2015 Bevis .................. H01J 37/3174
  250/396 R (Continued)

OTHER PUBLICATIONS

U.S. Appl. No. 14/947,241, Non-Final Office Action mailed on Dec. 5, 2016, 12 pages.

(Continued)

*Primary Examiner* — Michael Maskell
(74) *Attorney, Agent, or Firm* — Kilpatrick Townsend & Stockton LLP

(57) ABSTRACT

A multipole device for influencing a charged particle beam propagating along an optical axis is described. The multipole device includes: an electrostatic deflector with at least two deflector electrodes for deflecting the charged particle beam by a deflection angle, wherein the deflector electrodes extend over a first length along the optical axis; and an electrostatic corrector comprising at least four corrector electrodes to compensate for an aberration of the charged particle beam, wherein the corrector electrodes extend over a second length along the optical axis, which is shorter than the first length. A distance between a projection of the deflector electrodes on the optical axis and a projection of the corrector electrodes on the optical axis may be smaller than the first length so that, during operation of the multipole device, first fringe fields generated by the deflector electrodes and second fringe fields generated by the corrector (Continued)

electrodes may spatially overlap, wherein the electrostatic corrector may be configured to compensate for an aberration of the charged particle beam caused by the electrostatic deflector.

19 Claims, 7 Drawing Sheets

(56) References Cited

U.S. PATENT DOCUMENTS

| | | | | |
|---|---|---|---|---|
| 2008/0230711 | A1* | 9/2008 | Platzgummer | B82Y 10/00 250/396 R |
| 2012/0273690 | A1* | 11/2012 | Wieland | G03F 7/2059 250/396 R |
| 2015/0371811 | A1* | 12/2015 | Ogawa | H01J 37/12 250/305 |

OTHER PUBLICATIONS

U.S. Appl. No. 14/947,609, Notice of Allowance mailed on Dec. 5, 2016, 8 pages.

* cited by examiner

ELECTROSTATIC MULTIPOLE DEVICE, ELECTROSTATIC MULTIPOLE ARRANGEMENT, CHARGED PARTICLE BEAM DEVICE, AND METHOD OF OPERATING AN ELECTROSTATIC MULTIPOLE DEVICE

TECHNICAL FIELD

Embodiments described herein relate to electrostatic multipole devices for influencing a charged particle beam, e.g. an electron beam, for example, for inspection system applications, testing system applications, defect review or critical dimensioning applications, surface imaging applications (SEM) or the like, as well as to methods of operating an electrostatic multipole device. Embodiments also relate to an electrostatic multipole arrangement including two or more electrostatic multipole devices, and to a charged particle beam device, particularly to a charged particle beam device provided as a multi-beam system. Specifically, embodiments relate to a scanning charged particle beam device comprising at least one electrostatic multipole device.

BACKGROUND

Modern semiconductor technology has created a high demand for structuring and probing specimens in the nanometer or even in the sub-nanometer scale. Micrometer and nanometer scale process control, inspection or structuring is often done with charged particle beams, e.g. electron beams, which are generated, shaped, deflected and focused in charged particle beam devices, such as electron microscopes or electron beam pattern generators. For inspection purposes, charged particle beams offer superior spatial resolution compared to, e.g., photon beams because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance, in the case of an SEM, the primary electron (PE) beam generates particles like secondary electrons (SE) and/or backscattered electrons (BSE) that can be used to image and analyze a specimen.

One drawback of electron-beam based systems is the limited probe current within the focused spot. With increasing resolution (decreasing spot size), probe current is further decreased because of a reduced aperture angle required to control the aberrations. Higher brightness sources can provide only limited improvements for the probe current, because of the electron-electron interactions. Many approaches have been made to reduce e-e interactions in electron beam systems, which are, for example, reduced column length and/or higher column energy combined with late deceleration of the electron beam to the final landing energy just in front of the sample. However, improvement of single electron beam throughput at required resolution is increasingly challenging. One approach to solve such problems is the use of multiple beams, which may be generated by a single source within one column, which reduce the throughput by the number of beams.

Individually controlling, directing, deflecting, shaping, correcting, focusing, and steering the individual beamlets of such a multiple-beam system is, however, challenging. Electrostatic multipole deflectors and stigmators such as electrostatic octupole devices may be used for this purpose. However, it is difficult to sufficiently miniaturize electrostatic multipole devices and at the same time maintain excellent beam influencing properties and electrical field properties.

Further, also multipole devices for single charged particle beam systems may suffer from an insufficient quality of the electric fields which may lead to an increased spot size and impair the achievable spatial resolution of charged particle which may provide excellent field qualities to be used for deflecting and correcting charged particle beams.

SUMMARY

In light of the above, according to the independent claims, a multipole device for influencing a charged particle beam and a multipole arrangement with two or more multipole devices are provided. Further, a charged particle beam device with at least one multipole device is provided. According to a further aspect, methods of operating a multipole device for influencing a charged particle beam are provided. Further aspects, advantages, and features of the embodiments are apparent from the dependent claims, the description, and the accompanying drawings.

According to embodiments described herein, a multipole device for influencing a charged particle beam propagating along an optical axis is provided, including: an electrostatic deflector with at least two deflector electrodes for deflecting the charged particle beam by a deflection angle, wherein the deflector electrodes extend over a first length along the optical axis; and an electrostatic corrector comprising at least four corrector electrodes to compensate for an aberration of the charged particle beam, wherein the corrector electrodes extend over a second length along the optical axis, which is shorter than the first length. A distance between a projection of the deflector electrodes on the optical axis and a projection of the corrector electrodes on the optical axis is smaller than the first length so that, during operation of the multipole device, first fringe fields generated by the deflector electrodes and second fringe fields generated by the corrector electrodes spatially overlap, wherein the electrostatic corrector is configured to compensate for an aberration of the charged particle beam caused by the electrostatic deflector.

According to a further aspect described herein, a multipole device for influencing a charged particle beam propagating along an optical axis is provided, including: an electrostatic deflector with at least two deflector electrodes for deflecting the charged particle beam by a deflection angle, wherein the deflector electrodes extend over a first length along the optical axis; and an electrostatic corrector comprising at least four corrector electrodes to compensate for an aberration of the charged particle beam, wherein the corrector electrodes extend over a second length along the optical axis, which is shorter than the first length.

According to a further aspect described herein, a multipole arrangement for individually influencing at least a first beamlet of charged particles propagating along a first optical axis and a second beamlet of charged particles propagating along a second optical axis is provided, including: a first multipole device for influencing the first beamlet of charged particles, and a second multipole device for influencing the second beamlet of charged particles, which is arranged next to the first multipole device in a transverse direction with respect to the first and second optical axes. The first multipole device includes a first electrostatic deflector with at least two deflector electrodes for deflecting the first beamlet by a first deflection angle with respect to the first optical axis and an electrostatic corrector with at least four corrector electrodes to compensate for an aberration of the first beamlet. The second multipole device includes a second electrostatic deflector with at least two deflector electrodes for deflecting the second beamlet by a second deflection angle with respect to the second optical axis and an electrostatic corrector with at least four corrector electrodes to compensate for an aberration of the second beamlet. The corrector electrodes extend over a shorter length along the optical axis than the deflector electrodes, respectively.

According to a further aspect described herein, a charged particle beam device is provided, including: a beam source for generating a charged particle beam propagating along an optical axis; and a multipole device for influencing the charged particle beam, including an electrostatic deflector with at least two deflector electrodes for deflecting the charged particle beam by a deflection angle, wherein the deflector electrodes extend over a first length along the optical axis; and an electrostatic corrector comprising at least four corrector electrodes to compensate for an aberration of the charged particle beam, wherein the corrector electrodes extend over a second length along the optical axis, which is shorter than the first length.

According to a further aspect described herein, a method of operating a multipole device for influencing a charged particle beam propagating along an optical axis is provided, including: applying, over a first section along the optical axis, an electrostatic deflection field to the charged particle beam to deflect the charged particle beam by a deflection angle; and applying, over a second section along the optical axis shorter than the first section, an electrostatic correction field to the charged particle beam to compensate for an aberration of the charged particle beam.

Embodiments are also directed at apparatuses for carrying out the disclosed methods and include apparatus parts for performing the individual method actions. This method may be performed by way of hardware components, a computer programmed by appropriate software, by any combination of the two or in any other manner. Furthermore, embodiments according to the invention are also directed at methods of operating the described apparatus.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to one or more embodiments and are described in the following.

DETAILED DESCRIPTION

Figure 1A:
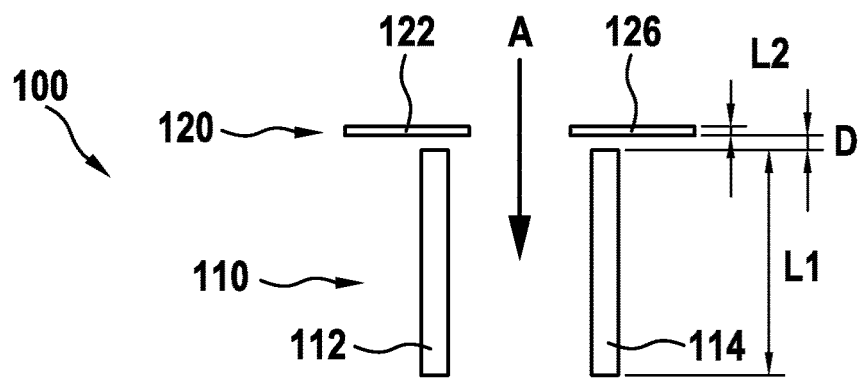
FIG. 1A shows a multipole device according to embodiments described herein in a schematic sectional view.

Reference will now be made in detail to the various embodiments of the invention, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Electrostatic multipole devices such as electrostatic quadrupole devices or electrostatic octupole devices may be used for correcting aberrations of beams of charged particles. For example, in an exemplary geometry, eight electrodes may be arranged, e.g. on the circumference of a circle, around the propagation path of the charged particle beam. For example, the electrodes may be equally spaced by 45° from each other. Depending on the desired influence on the charged particle beam, potentials of +V and −V may be alternately applied to the electrodes in order to provide for an octupole field for correcting an astigmatism of the charged particle beam. Alternatively, voltages of, e.g., +V, +√2/2V, 0, −√2/2V, −V, 42/2V, 0, +√2/2V may be applied to the electrodes in this order in the circumferential direction in order to provide for a dipole field suitable for deflecting the charged particle beam. In another example, four electrodes may be arranged, e.g. on the circumference of a circle, around the propagation path of the charged particle beam. For example, the electrodes may be equally spaced by 90° from each other in order to provide for an electrostatic quadrupole device. Potentials of +V and −V may be alternately applied to the electrodes in order to provide for a quadrupole field.

A dipole device with a single pair of deflector electrodes may be sufficient for deflecting a charged particle beam by a deflection angle with respect to an initial propagation direction. A first deflector electrode may be set on a first electric potential, and a second deflector electrode may be set on a second electric potential, so that an electric dipole field acts in a region between the deflector electrodes for deflecting the charged particle beam. However, beam aberrations, e.g. an astigmatism of the charged particle beam, or higher order beam distortions can typically only be corrected with higher order multipole correctors, e.g. with a quadrupole device or with an octupole device. Generally, the performance and accuracy of a multipole corrector can be increased by increasing the number of electrodes. For example, undesired decapole components of the fields can be avoided, if a large number of poles (N≥10) is provided. However, more electrodes generally lead to a complicated mechanical design and sophisticated supply electronics. Typically, an accurate beam aberration correction places high demands on the field quality of the electric correction field and, thus, high demands on the geometric setup of the corrector electrodes. Therefore, there is a need for multipole devices which are capable of both deflecting and providing an accurate aberration correction of a charged particle beam, and which can be manufactured without enormous effort.

Figure 1B:
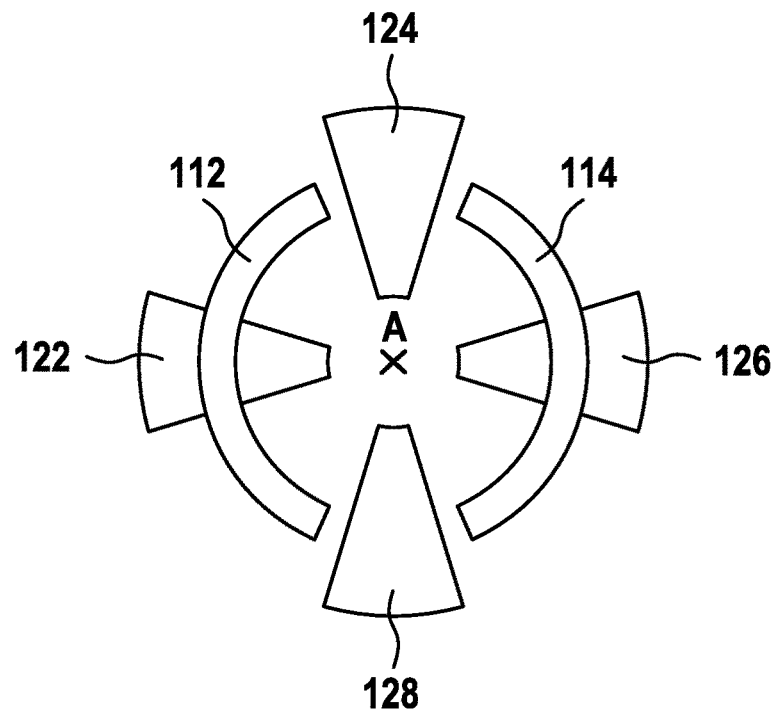
FIG. 1B shows the multipole device of FIG. 1A in a front view.

A multipole device 100 for influencing a charged particle beam propagating along an optical axis A according to embodiments described herein is shown in FIG. 1A in a schematic sectional view. A front view of the multipole device 100 is shown in FIG. 1B. The multipole device 100 includes an electrostatic deflector 110 with at least two deflector electrodes 112, 114 for deflecting the charged particle beam by a deflection angle, and an electrostatic corrector 120 comprising at least four corrector electrodes 122, 124, 126, 128 to compensate for aberrations of the charged particle beam. In the sectional view of FIG. 1A, only two oppositely arranged corrector electrodes 122 and 126 are visible. The deflector electrodes 112, 114 extend over a first length L1 along the optical axis A, and the corrector electrodes extend over a second length L2 along the optical axis, which is shorter than the first length L1.

In the case of different lengths of the individual corrector electrodes 122, 124, 126, 128, the second length L2 may be understood as the length along which all corrector electrodes overlap along the optical axis so that the resulting electric correction field in a region surrounded by the corrector electrodes is formed by the combinative effect of all of the corrector electrodes. In the case of different lengths of the individual deflector electrodes 112, 114, the first length L1 may be understood as the length along which all deflector electrodes overlap along the optical axis so that the resulting electric deflection field in a region surrounded by the deflector electrodes is formed by the combinative effect of all of the deflector electrodes.

According to some implementations, a projection of the corrector electrodes on the optical axis is shorter than a projection of the deflection electrodes on the optical axis. Due to the extended length of the deflector electrodes 112, 114 along the optical axis A as compared to the length of the corrector electrodes, a deflection field, e.g. an electric dipole field, which is essentially constant over the first length L1 along the charged particle beam path may be provided. An essentially constant deflection field may be needed for deflecting the charged particle beam by a predetermined deflection angle without causing substantial beam aberrations.

According to embodiments described herein, a multipole device suitable for both deflecting and correcting aberrations of the charged particle beam is provided. Deflection is performed by a first component of the multipole device, which is the electrostatic deflector 110, and correction is performed by a second component of the multipole device, which is the electrostatic corrector 120. The deflector electrodes may be arranged at a distance D from the corrector electrodes along the optical axis. In other words, in some implementations, no sectional plane perpendicular to the optical axis intersects both the deflector electrodes and the corrector electrodes. In other embodiments, the deflector electrodes may partially overlap with the corrector electrodes.

Providing differently shaped electrodes for deflecting and correcting in a multipole device and separating the tasks of deflecting and correcting the charged particle beam is based on the finding that electric deflection fields which are comparably strong and spatially extended may be needed, whereas correction fields may be beneficial which are weaker, but more complex. It is difficult to manufacture an electrostatic multipole corrector, e.g. an octupole or 12-pole device, with a long extension along the optical axis suitable for deflection purposes, but with a miniaturized lateral dimension suitable for multiple-beam-systems. On the other hand, a small lateral-sized, but long electrostatic deflector suitable for multi-beam systems may be manufactured without enormous effort, by providing a limited number of oppositely arranged deflector electrodes, e.g. a single pair of deflector electrodes 112, 114.

As the corrector electrodes 122, 124, 126, 128 may have a small extension along the optical axis A, the electrostatic corrector 120 may also be referred to as a "fringe field corrector". This is because the fringe fields which are present in the edge regions of the corrector electrodes along the optical axis may have a non-negligible effect on the charged particle beam and may substantially contribute to the correction provided by the electrostatic corrector. Fringe fields as used herein are electric fields generated by the respective electrodes in regions along the optical axis which are not partially surrounded by the electrodes in a circumferential direction. In particular, electric fields are typically not only present in a region between the electrodes, but electric fields may reach beyond the edges of the electrodes, where the field lines are typically inclined or curved with respect to a sectional plane perpendicularly intersecting the optical axis.

By combining a longer electrostatic deflector with a shorter fringe field corrector, the high deflection capability and sensitivity of a long electrostatic deflector may be combined with the correctional power and precision of an electrostatic multipole corrector within a single multipole device 100.

In some implementations, all of the corrector electrodes may be arranged in a single plane, which may be transverse or perpendicular to the optical axis A. For example, in the embodiment shown in FIG. 1A, all corrector electrodes are provided in a single plane extending perpendicular with respect to the optical axis A. Therefore, the electrostatic corrector may also be referred to as an "in-plane corrector".

The number of corrector electrodes of the electrostatic corrector may be higher than the number of deflector electrodes of the electrostatic deflector. For example, two deflector electrodes and four corrector electrodes, two deflector electrodes and eight corrector electrodes, or four deflector electrodes and eight corrector electrodes may be provided. In some cases, the electrostatic corrector may have more than eight corrector electrodes. In this case, the electrostatic corrector may be capable of compensating aberrations caused by the electrostatic deflector. The deflection direction of an electrostatic deflector with four deflection electrodes (e.g., two pairs of oppositely arranged deflection electrodes) may be adjustable.

The deflector electrodes may be configured to be connectable to a respective electric potential. For example, a voltage supply may be provided to set a first deflector electrode on a positive potential +V and to set a second deflector electrode arranged on an opposite side of the charged particle beam on a negative potential −V. Also the corrector electrodes may be configured to be connectable to respective electric potentials.

In some implementations, the second length L2 may be shorter than 500 μm, particularly shorter than 100 μm, more particularly shorter than 10 μm, or even shorter than 1 μm. For example, the second length L2 may be 100 nm or less.

In some embodiments, the first length L1 may be longer than 250 µm, particularly longer than 800 µm, more particularly 1 mm or longer. In some embodiments, the deflection electrodes may be provided on two opposite sides of the optical axis A to provide a clear diameter of more than 200 µm for the charged particle beam. The clear diameter provided by the deflector electrodes may be smaller than the first length L1, which is the extension length of the deflector electrodes along the optical axis A.

In some embodiments, a ratio (L1/L2) between the first length L1 and the second length L2 is more than 2, particularly more than 20. In some embodiments, the ratio between the first length L1 and the second length L2 is 100 or more. Beam aberrations caused by the deflector electrodes may be compensated even with corrector electrodes, the length of which is less than half, less than 20%, or less than 1% of the length of the deflector electrodes.

The electrostatic corrector may be arranged directly upstream or directly downstream from the electrostatic deflector. For example, no further beam shaping or beam steering device may be arranged between the electrostatic corrector and the electrostatic deflector. In this case, it may be sufficient to direct the charged particle beam to an entrance opening of the multipole device, whereupon the charged particle beam may appropriately propagate through both the electrostatic corrector and the electrostatic deflector. In particular, only a single beam steering stage or a single alignment action may be sufficient for both deflecting and correcting the charged particle beam. For example, the electrostatic deflector may be arranged directly downstream from the electrostatic corrector, as is illustrated in FIG. 1A.

In some embodiments, which may be combined with other embodiments disclosed herein, the multipole device may include more than one electrostatic corrector, for example a first electrostatic corrector arranged upstream from the electrostatic deflector and a further electrostatic corrector arranged downstream from the electrostatic deflector. A first distance between the deflector electrodes and the first corrector electrodes may be 5 mm or less, particularly 100 µm or less, and/or a second distance between the deflector electrodes and the further corrector electrodes may be 5 mm or less, particularly 100 µm or less. Each of the first electrostatic corrector and the further electrostatic corrector may be configured according to any of the embodiments described herein. In some embodiments, fringe fields generated by the deflector electrodes at an upstream edge of the electrostatic deflector may overlap with fringe fields generated by the first corrector electrodes, and/or fringe fields generated by the deflector electrodes at a downstream edge of the electrostatic deflector may overlap with fringe fields generated by the further corrector electrodes. If the electrostatic deflector is sandwiched between two electrostatic correctors, aberrations caused by the electrostatic deflector may be effectively compensated. For example, the upstream corrector may pre-correct a hexapole component to be introduced by the deflector and the downstream corrector may correct a quadrupole component caused by the deflector.

In some embodiments, two electrostatic deflectors may be provided, with an electrostatic corrector arranged between the two electrostatic deflectors.

In some embodiments which may be combined with other embodiments disclosed herein, a distance D between a projection of the deflector electrodes on the optical axis and a projection of the corrector electrodes on the optical axis is smaller than the first length L1. Alternatively or additionally, the distance D may other words, after having propagated past the corrector electrodes, the charged particles will propagate past the deflector electrodes immediately afterwards, or vice versa. Alternatively or additionally, the distance D may be larger than zero distance so that the corrector electrodes and the deflector electrodes do not overlap. Due to the close distance between the deflector electrodes and the corrector electrodes, in some embodiments, first fringe fields generated by the corrector electrodes may overlap with second fringe fields generated by the deflector electrodes. In the embodiment shown in FIGS. 1A and 1n FIG. 1B, the electrostatic deflector 110 is arranged downstream from the electrostatic corrector 120, wherein the distance D may be 5 mm or smaller, particularly 100 µm or smaller.

Figure 1C:
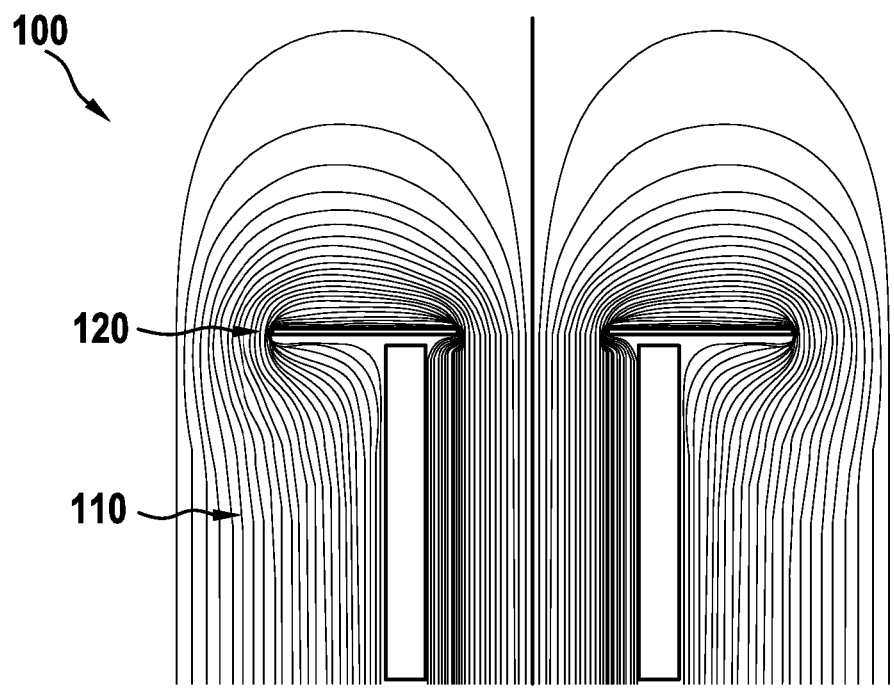
FIG. 1C shows an example of equipotential lines provided by the multipole device of FIG. 1A in a schematic sectional view.

FIG. 1C shows an exemplary distribution of equipotential lines provided by the multipole device 100. As is clearly visible from FIG. 1C, the second fringe fields generated by the corrector electrodes substantially spatially overlap with the first fringe fields generated by the deflector electrodes in the entrance region of the multipole device 100. As is shown in an exemplary way, due to the short extension of the corrector electrodes along the optical axis and due to the close distance D, substantial fringe fields may only be present on the entrance side of the electrostatic corrector (fringe field corrector), but not between the electrostatic corrector and the electrostatic deflector.

It is further visible from FIG. 1C that an electric dipole field which is essentially constant along the optical axis A in a volume circumscribed by the deflector electrodes 112, 114 may be provided. "Essentially constant" as used herein may mean that the electric field strength does not vary by more than +/−20% along more than 80% of the first length L1 along the optical axis (e.g. in the central inner volume of the electrostatic deflector).

The electrostatic corrector and the electrostatic deflector may be provided as an integrated multipole module, e.g. as a single MEMS-module (micro-electro-mechanical system). For example, the deflector electrodes and the corrector electrodes may be provided on a common support or on a common substrate. For example, both the deflector electrodes and the corrector electrodes may be fixed to a single substrate. Hence, a fixed spatial relationship between the deflector electrodes and the corrector electrodes can be provided. For example, by providing a spatial relationship between the electrostatic corrector and the electrostatic deflector which is fixed at least in a radial direction with respect to the optical axis A, it can be made sure that the charged particles leaving the electrostatic corrector centrally enter the electrostatic deflector, or vice versa.

In some implementations, a main extension direction of the deflector electrodes 112, 114 is parallel to the optical axis A and a main extension direction of the corrector electrodes 122, 126 is transverse, i.e. at an angle >0° with respect to the optical axis, particularly perpendicular to the optical axis. For example, the multipole device shown in FIG. 1A comprises two deflector electrodes extending essentially parallel with respect to the optical axis, whereas the four corrector electrodes extend essentially perpendicular to the optical axis, respectively.

Figure 2:
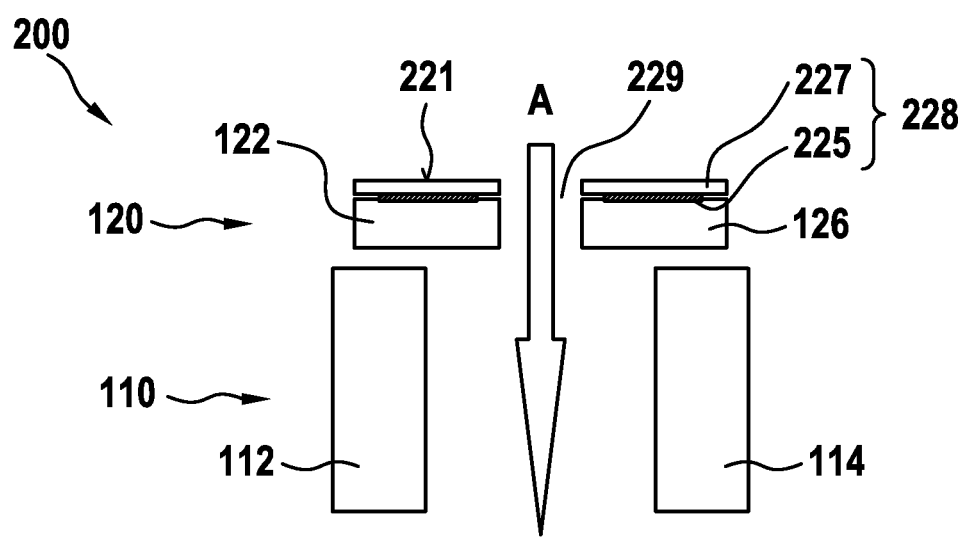
FIG. 2 shows a multipole device according to embodiments described herein in a schematic sectional view.

FIG. 2 shows a multipole device 200 according to embodiments described herein in a schematic sectional view. The multipole device 200 includes an electrostatic corrector 120 and an electrostatic deflector 110 arranged downstream from the electrostatic corrector. The electrostatic deflector 110 may be configured similar to the electrostatic deflector of the embodiment of FIG. 1A so that reference can be made to the above explanations which are not repeated here.

The electrostatic corrector 120 includes four or more corrector electrodes, two of which (122, 126) are shown in the sectional view of FIG. 2. In the embodiment shown in FIG. 2, the corrector electrodes are provided on a substrate 228 which may be a multilayer substrate. The substrate 228 may be provided with an aperture opening 229 for the charged particle beam which extends through the substrate along the optical axis A.

In some embodiments, the aperture opening may have a round or circular cross-sectional shape. In some embodiments, the aperture opening may have a triangular cross-sectional shape.

The corrector electrodes may be formed on top of a first main surface of the substrate 228 at respective angular positions around the aperture opening 229. In particular, the corrector electrodes may be held on the first main surface, e.g. by chemical bonding to the main surface. For example, in the case of a quadrupole device, the corrector electrodes 122, 124, 126, 128 may be provided at evenly spaced angular positions around the aperture opening 229, wherein two adjacent corrector electrodes may be provided at an angle of 90°.

The substrate 228 may be provided as a multilayer substrate with at least one insulator layer 225 which comprises the first main surface of the substrate on which the corrector electrodes are formed. In some embodiments, the substrate 228 may include at least one conductor or semiconductor layer 227 which comprises a second main surface 221 of the substrate 228 opposite the first main surface. The conductor or semiconductor layer 227 may comprise a material with a higher conductivity than the isolator layer 225. In some embodiments, the conductor or semiconductor layer 227 is directed to an upstream side of the electrostatic corrector 120. Charged particles of the charged particle beam impinging on the second main surface 221 of the substrate 228 will not accumulate on the second main surface as surface charges, because the second main surface 221 is a conducting or semiconducting surface.

On the inner surface of the aperture opening 229, the isolator layer 225 may be removed in a radial direction with respect to the conductor or semiconductor layer 227, in order to prevent surface charges from accumulating on an exposed insulator surface.

The corrector electrodes may be provided as conductive layer sections on top of the insulator layer 225. The corrector electrodes may be formed on the insulator layer 225 by applying a mask on a three-layer substrate and removing portions of an initially uniform electrode-forming layer so that remaining portions of the electrode-forming layer form the corrector electrodes.

In some embodiments, the conductor electrodes may comprise or consist of silicon or doped silicon. In order to manufacture the conductor electrodes, an initially essentially uniform silicon layer which may be the top layer of a SOI-wafer may be partially removed, e.g. etched, to so that the remaining portions of the silicon layer form the corrector electrodes 122, 124, 126, 128.

The charged particle beam propagating along the optical axis A may enter the aperture opening 229 of the electrostatic corrector, may then be corrected by the electric correction field generated by the corrector electrodes, and may then be deflected by the electric deflection field generated by the deflector electrodes. In some cases, a beam aberration caused by the deflection field may already be pre-compensated by the correction field which may be located upstream from the deflection field. Alternatively or additionally, the electrostatic corrector or an additional electrostatic corrector may be arranged downstream from the electrostatic deflector. For example, the electric deflection field provided by the deflector electrodes may have a negative hexapole component in addition to a dipole component. This negative hexapole component may be compensated for by a positive hexapole component of an electric correction field applied by the corrector electrodes. The overall electric field quality may be substantially improved.

The electrostatic deflector may be configured for deflecting the charged particle beam by a deflection angle of 10° or less, particularly of 2° or less, more particularly of 30' or less and/or by a deflection angle of 1' or more, particularly 10' or more.

In some embodiments, which may be combined with other embodiments described herein, the electrostatic deflector is configured as a dipole deflector with at least one pair of divided circle electrodes. Each deflector electrode may be provided as a part of an annular shell, which extends in a circumferential direction around the optical axis, e.g. over an angle of 120°. A 2-pole 120° deflector device may be suitable for minimizing aberrations and avoiding distortions or changes in magnification. Such a deflector device is shown in the front view of FIG. 1B in a schematic way, and it is shown in the sectional view of FIG. 2. A dipole deflector, e.g. a 2-pole 120° deflector, is easier to manufacture than a multipole corrector, e.g. an octupole corrector, because the gap between adjacent electrodes in a circumferential direction is larger in the case of a dipole deflector as compared to a multipole corrector such as an octupole corrector. For example, in the case of a 2-pole 120° deflector, a gap of 60° is provided between the dipole electrodes so that etching the dipole electrodes is possible without substantial effort. In particular, a dipole deflector may be manufactured without high aspect ratio etching.

In some embodiments, two or more pairs of deflector electrodes may be provided as plate electrodes arranged on opposing sides of the charged particle beam. The plate electrodes may be provided as flat plate electrodes. In some embodiments, two pairs of flat deflector electrodes may be provided. In some embodiments, at least an inner electrode surface of the deflector electrodes may be curved, respectively, in a circumferential direction. In some embodiments, the electrostatic deflector may be configured as an octupole with eight deflector electrodes. An octupole deflector device may be configured for applying a high quality electric dipole field to the charged particle beam for deflecting the charged particle beam by a deflection angle.

Figure 3:
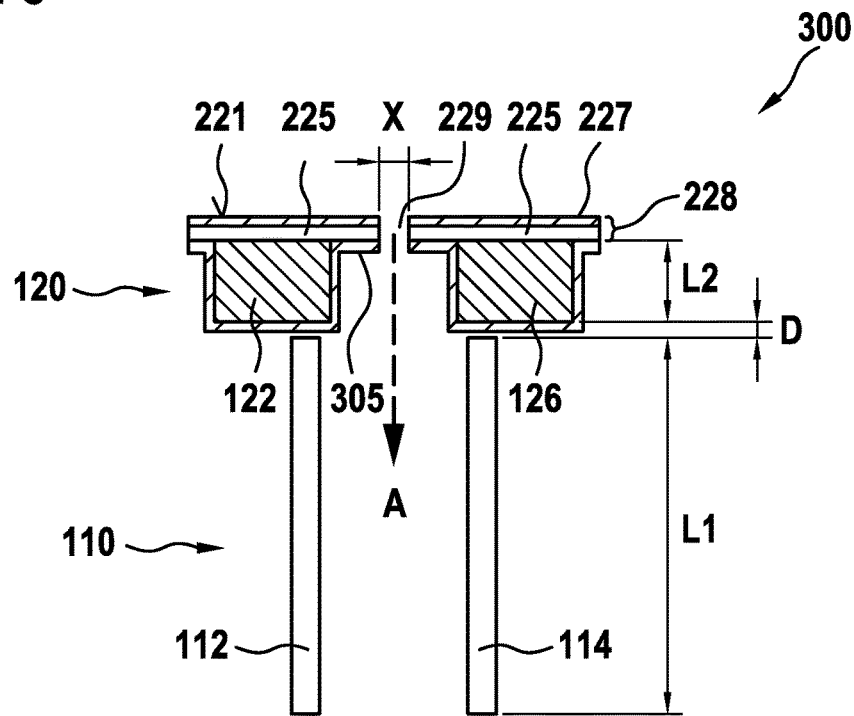
FIG. 3 shows a multipole device according to embodiments described herein in a schematic sectional view.

FIG. 3 shows a multipole device 300 according to embodiments disclosed herein in a schematic sectional view. The multipole device 300 includes an electrostatic corrector 120 and an electrostatic deflector 110 arranged downstream from the electrostatic corrector. The electrostatic deflector 110 may be configured similar to the electrostatic deflector of the embodiment of FIG. 1A so that reference can be made to the above explanations which are not repeated here. For example, the electrostatic deflector 110 may be provided with deflector electrodes 112, 114 which are configured as plate electrodes or as divided annular electrodes.

The electrostatic corrector 120 is configured as a multipole device with at least four corrector electrodes arranged at respective angular positions around the optical axis A, two of which (122, 126) are shown in the sectional view of FIG. 3. The corrector electrodes may be provided on top of an insulator layer 225 of a substrate 228 which is provided with an aperture opening 229 for the charged particle beam. The aperture opening 229 extends along the optical axis A through the substrate 228.

As can be taken from FIG. 3, in some embodiments, which can be combined with other embodiments described herein, a minimum distance between two of the corrector electrodes 122, 126 which are arranged on opposite sides of the optical axis A is larger than the minimum diameter X of the aperture opening 229. In some implementations, a ratio between the minimum distance between opposedly arranged corrector electrodes 122, 126 and the minimum diameter X (clear diameter) of the aperture opening 229 may be 2 or more, particularly 5 or more. Therefore, the charged particle beam may propagate at a distance from the corrector electrodes 122, 126 so that edge effects which may be present in radially outer regions of the electric correction field do not negatively affect the beam shape.

The aperture opening 229 may be configured as a beam limiting opening. In other words, the diameter of the charged particle beam upstream from the electrostatic corrector may be larger than the diameter X of the aperture opening 229, so that the beam may be partially blocked by the edge of the aperture opening 229 and may centrally enter between the corrector electrodes 122, 126 at a distance therefrom. Correction accuracy can be increased. A conductor or semiconductor layer 227 arranged on an upstream side of the insulator layer 225 may prevent surfaces charges of blocked beam portions to accumulate on an upstream main surface of the electrostatic corrector.

In some embodiments, the electrostatic corrector 120 may comprise a high-resistance layer 305 which extends at least partially around the optical axis A between at least two of the corrector electrodes and is configured to allow a current flow between the at least two of the corrector electrodes.

The high-resistance layer 305 may be a coating which at least partially covers a first main surface of the insulator layer 225 in a region between the corrector electrodes. In some implementations, the high-resistance layer 305 covers both the corrector electrodes which are formed on the insulator layer 225 and portions of the insulator layer 225 on which no corrector electrodes are formed. For example, in the embodiment shown in FIG. 3, the entire downstream surface of the electrostatic corrector 120 is covered with the high-resistance layer 305.

The high-resistance layer 305 may be a carbon layer. Alternatively or additionally, the high-resistance layer 305 may be configured such that two corrector electrodes which are adjacent to each other in a circumferential direction are not completely electrically isolated from each other. Rather, a small current of 100 nA or less, particularly 1 nA or less may flow between adjacent corrector electrodes which are set on different electric potentials. Alternatively or additionally, the high-resistance layer 305 may have a thickness of 10 nm or more, particularly 100 nm or more and/or a thickness of 100 µm or less, particularly 10 µm or less. Alternatively or additionally, the high-resistance layer may be provided with a predetermined thickness and geometry and be made of a predetermined material such that an electric resistance of more than 1 MΩ and less than 100 GΩ, particularly more than 10 MΩ and less than 10 GΩ, between two corrector electrodes which are adjacent to each other in the circumferential direction is obtained.

By providing the high-resistance layer 305 on top of the isolator layer 225, exposed insulating surfaces of the electrostatic corrector may be avoided, and an essentially continuous drop or rise of electric potential between adjacent corrector electrodes can be achieved. Thus, the spatial properties of the electric correction field can be improved.

As is shown in FIG. 3, a second main surface 221 of the substrate which may be a conductor or semiconductor surface provided with the aperture opening 229 is directed to an upstream side of the electrostatic corrector. Further, a first main surface of the substrate on which the corrector electrodes are formed is directed to a downstream side of the electrostatic corrector 120, and the electrostatic deflector 110 is arranged downstream from the electrostatic corrector 120. Accordingly, the multipole device according to embodiments described herein may be used for centering the charged particle beam with respect to the corrector and deflector electrodes, and for both correcting and deflecting the centered charged particle beam. At the same time, the multipole device may be a very compact device which is comparably easy to manufacture.

Figure 4:
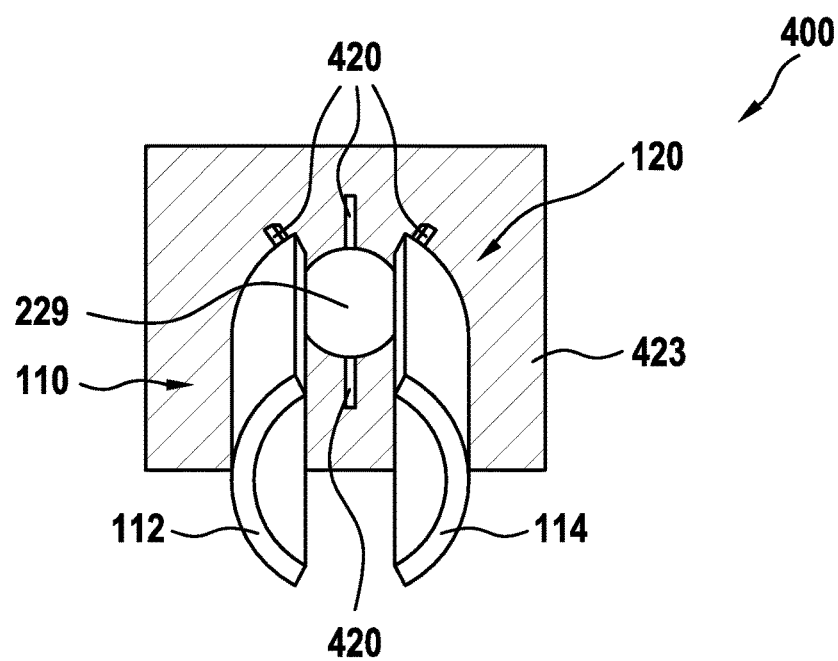
FIG. 4 shows a multipole device according to embodiments described herein in a schematic perspective view.

FIG. 4 shows a multipole device 400 according to embodiments disclosed herein in a schematic view. The multipole device 400 includes an electrostatic corrector 120 and an electrostatic deflector 110 arranged downstream from the electrostatic corrector 120. The electrostatic deflector 110 may be configured similar to the electrostatic deflector of the embodiment of FIG. 1A so that reference can be made to the above explanations which are not repeated here. For example, the electrostatic deflector 110 may be provided with two deflector electrodes 112, 114 which are configured as divided annular electrodes extending over an angle of, e.g., 120°, respectively.

The electrostatic corrector 120 shown in FIG. 4 is configured as an octupole device and includes eight corrector electrodes 420. The corrector electrodes 420 may be provided on a first main surface of a substrate 423 with an aperture opening 229 for the charged particle beam. In the shown embodiment, the corrector electrodes 420 are arranged at evenly spaced angular positions around the aperture opening 229.

In some embodiments, the electrostatic corrector 120 may be provided with more than eight corrector electrodes. For example, the electrostatic corrector may be configured as a 12-pole corrector comprising 12 corrector electrodes, or as a 20-pole corrector comprising 20 corrector electrodes.

An electrostatic corrector with multiple electrodes may be configured for correcting at least one of a beam aberration caused by the electrostatic deflector, an astigmatism of the charged particle beam, a spherical aberration of the charged particle beam, and a hexapole or a higher order aberration of the charged particle beam—in some cases in combination with further electrostatic multipole devices. In some implementations, the electrostatic corrector can be configured for focusing or defocusing the charged particle beam.

The corrector electrodes 420 may be provided as conductive lines extending in a radial direction with respect to the optical axis A, respectively. The conductive lines may have a thickness (which corresponds to the second length L2 along the optical axis) of less than 500 µm, particularly less than 100 µm, more particularly less than 10 µm.

In some embodiments, each of the corrector electrodes 420 may extend over an angular range of less than 30°, particularly less than 10°, more particularly 5° or less. Such an arrangement of corrector electrodes 420 with a small angular extension may avoid angular regions of constant electric potential in a circumferential direction around the optical axis A.

The deflector electrodes 112, 114 may also be provided on the substrate 423. For example, also the deflector electrodes 112, 114 may be fixed to the first main surface of the substrate 423. Alternatively, the electrostatic deflector 110 may include a second substrate or a further support on which the deflector electrodes are held.

Figure 5:
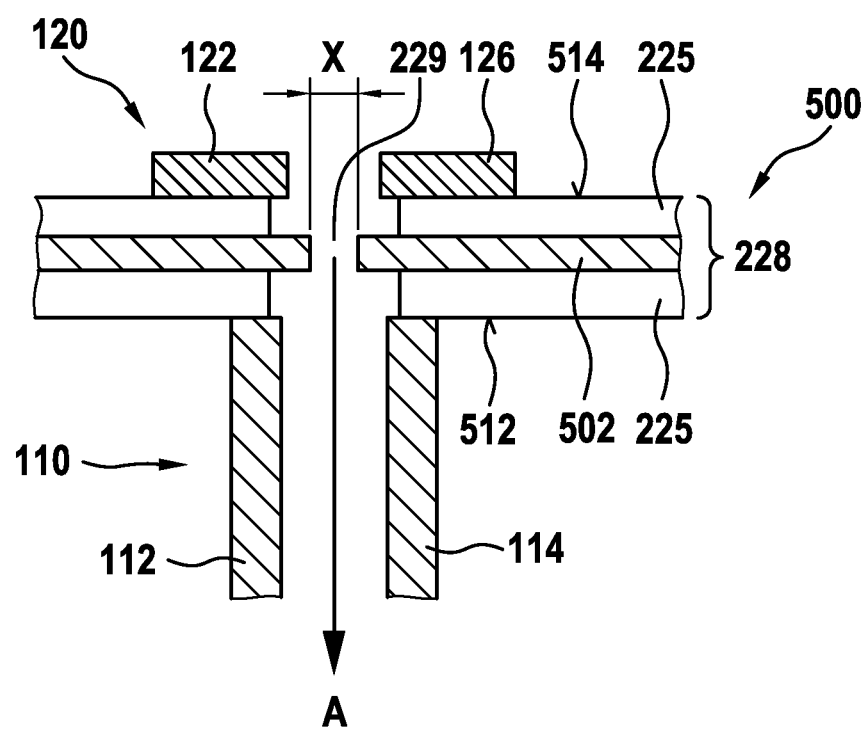
FIG. 5 shows a multipole device according to embodiments described herein in a schematic sectional view.

FIG. 5 shows a multipole device 500 according to embodiments disclosed herein in a schematic view. The multipole device 500 includes an electrostatic corrector 120 and an electrostatic deflector 110 arranged downstream from the electrostatic corrector 120. The electrostatic deflector 110 may be configured similar to the electrostatic deflector of the embodiment of FIG. 1A so that reference can be made to the above explanations which are not repeated here. For example, the electrostatic deflector 110 may be provided with two deflector electrodes 112, 114 which are configured as divided annular electrodes extending over an angle of, e.g., 120°, respectively.

The electrostatic corrector 120 may configured as a multipole device with at least four corrector electrodes arranged at respective angular positions around the optical axis A, two of which (122, 126) are shown in the sectional view of FIG. 5. The corrector electrodes may be provided on top of an insulator layer 225 of a substrate 228 which is provided with an aperture opening 229 for the charged particle beam. The aperture opening 229 extends along the optical axis A through the substrate 228.

As can be taken from FIG. 5, in some embodiments, which can be combined with other embodiments described herein, both the corrector electrodes 122, 126 and the deflector electrodes 112, 114 may be provided on and/or fixed to a support device, which may be the substrate 228. For example, the deflector electrodes may be formed on a first main surface 512 of the substrate 228. Alternatively or additionally, the corrector electrodes may be formed on a second main surface 514 of the substrate 228. The first main surface 512 may be directed to a downstream side of the substrate and the second main surface 514 may be directed to an upstream side of the substrate.

In some embodiments, the corrector electrodes may be formed on an insulator layer 225 of the substrate, and the deflector electrodes may be formed on an insulator layer 225 of the substrate, e.g. on the other main side of the same insulator layer or on a second insulator layer. The substrate 228 shown in FIG. 5 has two insulator layer 225, wherein an inner layer 502 is sandwiched between the insulator layers. The inner layer may be a conductor or a semiconductor layer. This arrangement allows the aperture to have a different potential as compared to the corrector and the deflector electrodes so that the aperture can, e.g., be configured as a lens.

In some embodiments, the substrate 228 may include an inner layer 502, wherein the part of the aperture opening 229 with the smallest clear width, i.e. the beam limiting aperture, is formed in the inner layer. In some embodiments, which may be combined with other embodiments described herein, an exposed surface of the insulator layers 225 may be partially removed, e.g. etched back. Therefore, no surface charged may accumulate on exposed insulating surface portions.

The thickness of the substrate 228 may be less than 5 mm or less than 1 mm so that the distance D between a projection of the deflector electrodes on the optical axis and a projection of the corrector electrodes on the optical axis is smaller than 5 mm or smaller than 1 mm. In some embodiments, first fringe fields generated by the deflector electrodes may spatially overlap with second fringe fields generated by the corrector electrodes. The electrostatic corrector may be configured to compensate for or reduce an aberration of the charged particle beam caused by the electrostatic deflector.

The ratio between the first length L1 of the deflector electrodes along the optical axis and the second length L2 of the corrector electrodes along the optical axis may be more than 1, particularly two or more, more particularly 100 or more.

Figure 6:
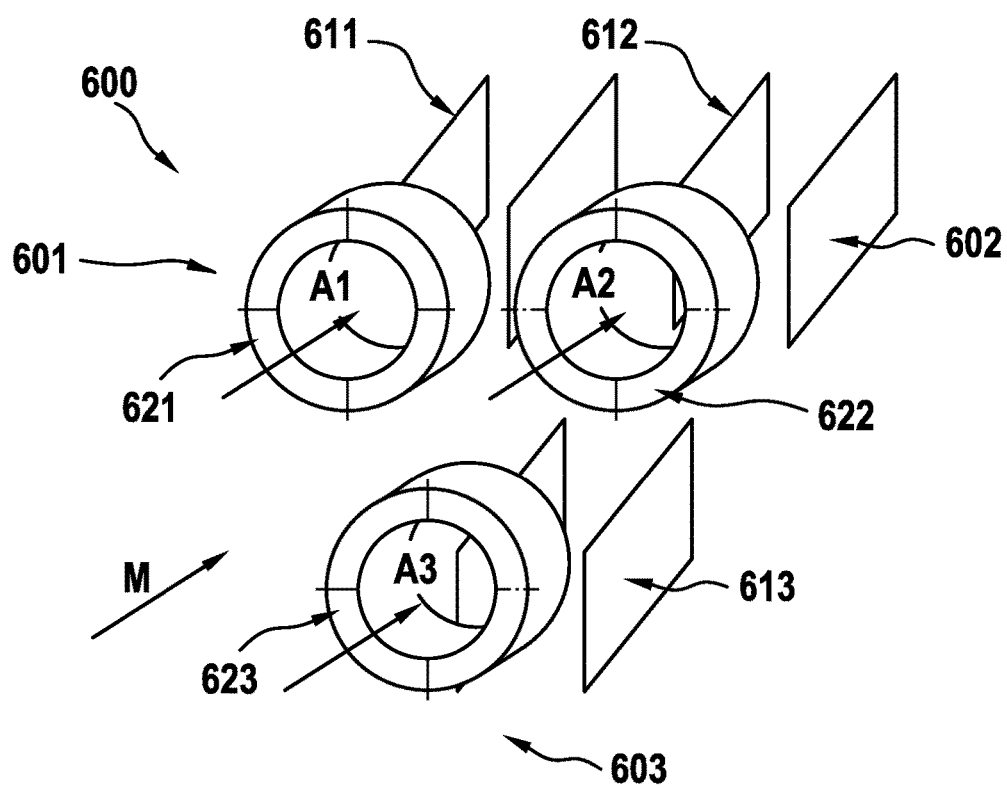
FIG. 6 shows a multipole arrangement including three multipole devices according to embodiments described herein in a schematic perspective view.

FIG. 6 shows an electrostatic multipole arrangement 600 according to embodiments described herein in a schematic perspective view. The electrostatic multipole arrangement 600 is configured for individually influencing a first beamlet, a second beamlet, and a third beamlet of charged particles propagating side-by-side along a main propagation direction M. The beamlets may propagate parallel with respect to each other. In some cases, the beamlets may propagate at an angle with respect to each other, e.g. at an angle smaller than 100 mrad, particularly smaller than 15 mrad. For example, the beamlets may come from a single beam source. In this case, the main propagation direction M may correspond to the main emission direction of the beam source.

The multipole arrangement 600, which may also be referred to as a multipole array or as an "array of multipole devices", comprises a first multipole device 601, a second multipole device 602, and a third multipole device 603 in accordance with any of the embodiments described herein. Each of the multipole devices 601, 602, 603 includes an electrostatic corrector and an electrostatic deflector. The electrostatic correctors may be configured as quadrupole devices, octupole devices, 12-pole devices, 20-pole devices, as appropriate. The electrostatic correctors may include a single pair of deflector electrodes, or two pairs of deflector electrodes.

The first electrostatic multipole device 601 may be configured for influencing the first beamlet of charged particles propagating along a first optical axis A1 and includes a first electrostatic corrector 621 and a first electrostatic deflector 611. The second multipole device 602 may be configured for influencing the second beamlet of charged particles propagating along a second optical axis A2 and includes a second electrostatic corrector 622 and a second electrostatic deflector 612. The third multipole device 603 may be configured for influencing the third beamlet of charged particles propagating along a third optical axis A3 and includes a third electrostatic corrector 623 and a third electrostatic deflector 613.

The multipole arrangement 600 may include only two or more than three multipole devices, e.g. five, ten or more multipole devices which may be arranged in a given 1-dimensional or 2-dimensional pattern or array. For example, the multipole arrangement may be provided in the form of a 2-dimensional multipole array.

The distance between the centers of two adjacent multipole devices of the array may be less than 5 mm, particularly less than 3 mm, more particularly less than 2 mm, in a sectional plane perpendicularly intersecting the main propagation direction M. In some embodiments. All multipole devices may be held on a common support, e.g. on a common substrate, plate or board. In some embodiments, only all corrector electrodes may be held on a common substrate, and the deflector electrodes may be held on a further support.

The first, second, and third electrostatic deflectors may include plate electrodes, as shown in FIG. 6. Alternatively, the deflector electrodes may be configured as curved electrodes, e.g. as divided annular electrodes.

In some embodiments, a multipole arrangement may include a substrate with two or more aperture openings which extend through the substrate in a predetermined array pattern, e.g. round or circular aperture openings. Each aperture opening may be configured for generating a beamlet of charged particle beams, e.g. a round or circular beamlet, from a wide-angle charged particle beam emitted by a beam source, e.g. an electron source. An upstream surface of the substrate may be a conductive or semiconductor surface so that charged particles hitting said surface cannot accumulate as surface charges.

In some implementations, which may be combined with other implementations described herein, the corrector electrodes of the electrostatic correctors are held on a first main surface of the substrate and may be arranged on circular lines extending around the aperture openings.

The multipole devices of the multipole arrangement 600 may have some or all of the features described above with regard to FIGS. 1 to 4 in any combination as appropriate so that reference can be made to the above explanations. In particular, the deflector electrodes of the first electrostatic deflector 611 have a length along the first optical axis A1 which is longer than a length of the corrector electrodes of the first electrostatic corrector 621 along the first optical axis A1. The deflector electrodes of the second electrostatic deflector 612 have a length along the second optical axis A2 which is longer than a length of the corrector electrodes of the second electrostatic corrector 622 along the second optical axis A2. The deflector electrodes of the third electrostatic deflector 613 have a length along the third optical axis A3 which is longer than a length of the corrector electrodes of the third electrostatic corrector 623 along the third optical axis A3. In some implementations, all of the deflector electrodes may have a first length along the respective optical axis which is longer than a second length of all of the corrector electrodes along the respective optical axis.

Figure 7:
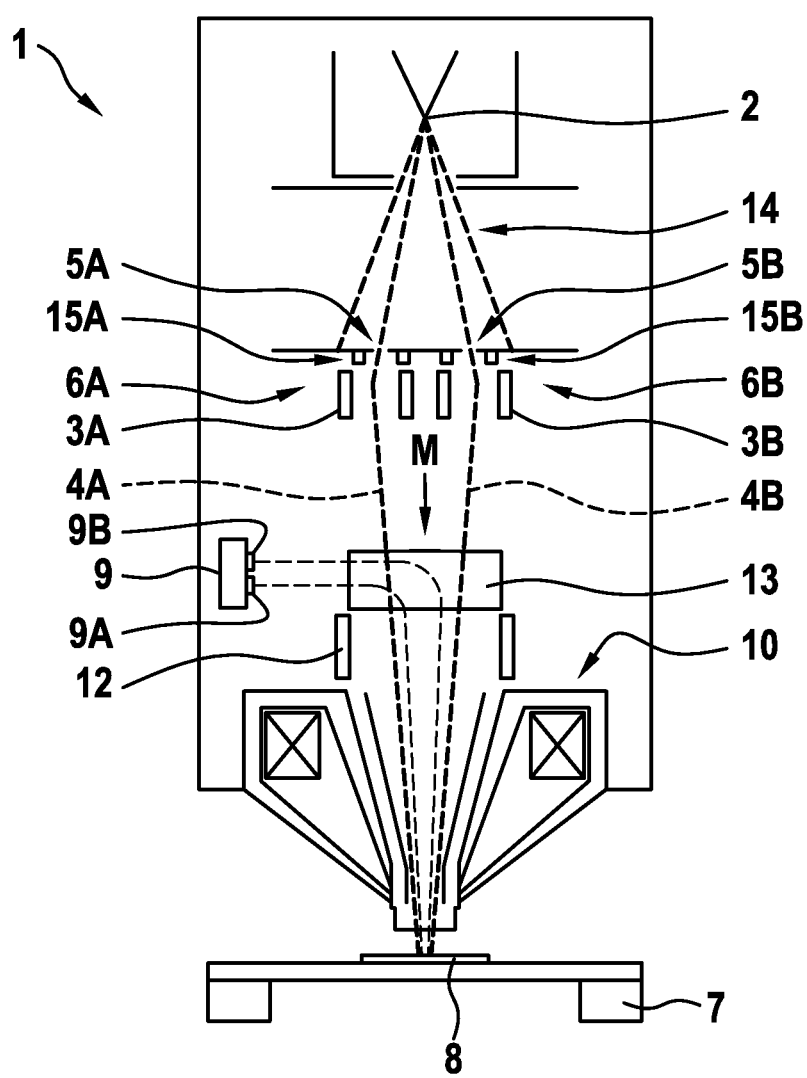
FIG. 7 shows a charged particle beam device according to embodiments described herein in a schematic view.

FIG. 7 shows a charged particle beam device 1 with two multipole devices 6A and 6B according to embodiments described herein. In other embodiments, only a single multipole device or more than two multipole devices, which can be arranged in a two-dimensional array, may be provided.

In the embodiment shown in FIG. 7, the multipole devices 6A, 6B may be configured for influencing two beamlets 4A, 4B of charged particles which propagate side-by-side along a main propagation direction M. Influencing a beamlet includes at least correcting aberrations of the beamlet via corrector electrodes of an electrostatic corrector, and deflecting the beamlet via deflector electrodes of an electrostatic corrector, respectively.

The deflector electrodes of the electrostatic deflectors 3A, 3B extend over respective first lengths along the respective optical axis, and the corrector electrodes of the electrostatic correctors 15A, 15B extend over respective second lengths along the respective optical axis, wherein the second lengths are shorter than the first lengths, particularly less than half of the first lengths, more particularly less than 1/100 the first lengths.

A beam source 2 may be configured for emitting a charged particle beam 14. As described herein, a cold field emitter (CFE), a Schottky emitter, a TFE or another high current e-beam source may be provided, e.g. to increase the throughput. A high current is considered to be 10 μA in 100 mrad or above, for example up to 5 mA, e.g. 30 μA in 100 mrad to 1 mA in 100 mrad. According to typical implementations, the current is distributed essentially uniform, e.g. with a deviation of +−10%, particularly in the case of a linear or rectangular array. According to some embodiments, which can be combined with other embodiments described herein, the source or virtual source can have a diameter of 2 nm to 40 nm and/or may have a typical emission half angle of 5 mrad or above, e.g. 50 mrad to 200 mrad.

According to yet further embodiments, which can be combined with other embodiments described herein, a TFE or another high reduced-brightness source, e.g. an e-beam source, capable of providing a large beam current is a source where the brightness does not fall by more than 20% of the maximum value when the emission angle is increased to provide a maximum of 10 μA-100 μA, for example 30 μA. Schottky or TFE emitters are currently available with a measured reduced-brightness of $5 \cdot 10^7$ $Am^{-2}(SR)^{-1}V^{-1}$, CFE emitters have a measured reduced-brightness of up to $5 \cdot 10^9$ $Am^{-2}(SR)^{-1}V^{-1}$. The system may also work with a carbide emitter such as a HfC which can have a reduced brightness of approximately $1.1011$ $Am^{-2}(SR)^{-1}V^{-1}$. For example, a beam which has at least $5 \cdot 10^7$ $Am^{-2}(SR)^{-1}V^{-1}$ is beneficial.

After leaving the charged particle source 2, the generated charged particle beam 14 may pass through aperture openings of a substrate having multiple aperture openings 5A, 5B. The aperture openings can be situated along a ring on the substrate or along any other arrangement or array such as a line, rectangle, or square. By passing through the aperture openings 5A, 5B of the substrate, multiple charged particle beams or beamlets 4A, 4B are created. The corrector electrodes of the multipole devices 6A, 6B may be formed on a downstream side of the substrate. Alternatively, the corrector electrodes of the multipole devices may also be arranged at a distance from the substrate, e.g. on top of a further substrate or support. The corrector electrodes of the electrostatic correctors 15A, 15B are configured for providing an electric correction field. By propagating through the electric correction field, beam aberrations may be compensated for. Thereafter, the beamlets may propagate through the electrostatic deflectors 3A, 3B arranged downstream from the electrostatic correctors 15A, 15B, where the individual beamlets 4A, 4B are deflected such that each beamlet 4A, 4B appears to come from a different source.

Thereafter, the charged particle beams or beamlets 4A, 4B may pass a beam separator assembly 13, which may be configured to separate the primary beams from secondary beams or backscattered beams, i.e. signal beams.

Thereafter, the beamlets 4A, 4B may pass a scanning deflector 12, surface of a specimen 8. After the scanning deflector 12, the beamlets 4A, 4B enter an objective lens 10 that focuses the beamlets 4A, 4B onto the specimen 8. The objective lens 10 not only focuses the beamlets 4A, 4B, but also rotates the beamlets 4A, 4B. However, this effect is not shown because it is difficult to depict in a two-dimensional drawing and because the skilled person is well aware of this additional effect. Due to the combined effects of the multipole devices 6A, 6B and the objective lens 10, multiple spots (images of the particle source 2), each corresponding to one of the beamlets 4A, 4B, are created on the specimen 8.

When the beamlets 4A, 4B strike the surface of the specimen 8, they undergo a series of complex interactions with the nuclei and electrons of the atoms of the specimen. The interactions produce a variety of secondary products, such as electrons of different energy, X-rays, heat, and light. Many of these secondary products are used to produce the images of the sample and to collect additional data. A secondary product of major importance to examination or the image formation of the specimen are secondary electrons that escape from the specimen 8 at a variety of angles with relatively low energy (1 to 50 eV). The signal electrons are extracted from the specimen through the objective lens 10, are separated from the primary beams in the beam separator assembly 13, and reach a detector assembly 9. The detector assembly 9 may include detector elements 9A, 9B, which are configured for generation of a measurement signal, e.g. an electronic signal corresponding to the detected signal electrons.

By scanning the beamlets 4A, 4B over the specimen 8 and displaying/recording the output of the detector assembly 9 or detector elements 9A, 9B, multiple independent images of the surface of the specimen 8 are generated. Each image contains information about a different portion of the surface of the specimen. Accordingly, the speed of the data acquisition is increased with regard to the conventional single beam case. The specimen 8 may be supported on a stage 7 (specimen support) which is moveable horizontally in all directions, in order to allow the beamlets 4A, 4B to reach the target areas on direction while the beams are scanned in a second direction. This will improve throughput further, since no stage settling time is required.

In order to improve the performance of the system, the embodiment shown in FIG. 7 may contain an objective lens 10, which is a combination of a magnetic lens and an electrostatic lens. Accordingly, the objective lens 10 is a compound magnetic-electrostatic lens. The electrostatic part of the compound magnetic-electrostatic lens 10 may be an electrostatic retarding lens. Using such a compound magnetic-electrostatic lens 10 yields superior resolution at low landing energies, such as a few hundred electron volts in the case of a SEM. Such low landing energies are desirable, especially in modern semiconductor industry, to avoid charging and/or damaging of radiation sensitive specimens. However, in some cases, only a magnetic lens or only an electrostatic lens may be used.

According to embodiments described herein, a single-beam column with a single charged particle beam may be provided. According to some embodiments, a multi-beamlet column may be provided with a number of beams, such as two or more, or 5 or more, or 8 or more, according to some examples up to 200. The multi-beamlet column is configured such that the multi-beamlet column can also be arrayed in a multi-column system. Arraying multiple columns then provides an even higher number of beamlets working on the same sample (e.g. a wafer or a mask).

According to embodiments described herein, the primary electron beams and the secondary or signal electron beams are separated; particularly the signal electron detection is conducted off-axis, i.e. off-axis with respect to the optical axis defined by the objective lens. An efficient detection with negligible crosstalk between the different signals and a small or no effect on the primary beam performance can be provided. According to yet further embodiments, which can be combined with other embodiments described herein, the pitch of the primary beams on the sample is large enough that the pitch of the signal-electron-beamlets is sufficient such that the signal electron detection can be performed without or at least with negligible crosstalk. For example, the pitch on the specimen, e.g. a wafer, i.e. a minimal distance between two primary beamlets on the specimen, can be 10 μm or above, for example 40 μm to 100 μm. Accordingly, embodiments provide a multi-beam device which generates a reasonable number of primary electron beamlets within one electron optical column, wherein crosstalk is reduced, and which optionally provides the opportunity to array several of the multi-beam devices, i.e. multiple of the columns. Accordingly, it is further desired to have the option to array multi beamlet columns in a multi-column module (MCM).

According to a further aspect described herein, a method of operating a multipole device for influencing a charged particle beam propagating along an optical axis is described.

Figure 8:
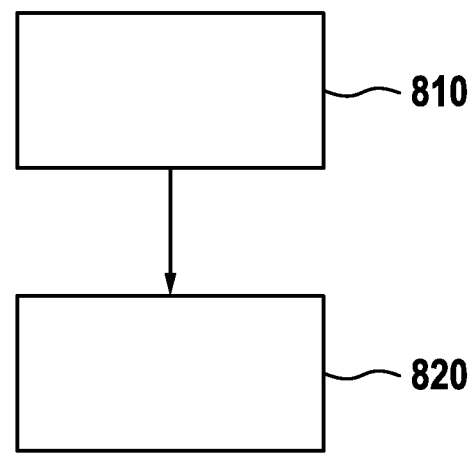
FIG. 8 is a flow diagram illustrating a method of operating a multipole device according to embodiments described herein.

FIG. 8 is a flow chart for illustrating a method according to embodiments described herein. The method includes, in box 810, applying, over a first section along the optical axis, an electrostatic deflection field to the charged particle beam to deflect the charged particle beam by a deflection angle; and, in box 820, applying, over a second section along the optical axis shorter than the first section, an electrostatic correction field to the charged particle beam to compensate for an aberration of the charged particle beam.

According to some embodiments, the first section is arranged upstream from the second section along the optical axis so that the charged particle beam is first deflected and then corrected.

According to some embodiments, the first section is arranged upstream from the second section along the optical axis, so that the charged particle beam is first corrected and then deflected.

According to some embodiments, an electrostatic correction field is applied to the charged particle beam upstream from and downstream from the electrostatic deflection field.

The first section may be a section of the charged particle beam, which is at least partially surrounded by deflector electrodes of an electrostatic deflector. The second section may be a section of the charged particle beam, which is at least partially surrounded by corrector electrodes of an electrostatic corrector.

In some embodiments, the electrostatic deflection field may be a dipole field. In some embodiments, the electrostatic correction field may be a quadrupole field, an octupole field, or an even higher order multipole field, e.g. a 12-pole field, a 14-pole field, or a 20-pole field.

In some embodiments, a distance between the first section and the second section may be 5 mm or less, particularly 100 μm or less. In some embodiments, the first section may overlap with the second section. In some embodiments, the first section may be arranged at a distance from the second section, e.g. a distance in a range between 0 mm and 1 mm.

The first section may have a length L1 of more than 250 μm or more than 500 μm. The second section may have a length L2 of less than 500 μm, particularly less than 10 μm. A distance D between the first section and the second section may be shorter than the first length L1. In some embodiments, the distance D is 5 mm or shorter, particularly 100 μm or shorter.

According to some embodiments, which can be combined with other embodiments described herein, one or more beamlets of charged particles are created from a charged particle beam by sending the charged particle beam through a substrate with one or more aperture openings which have a diameter smaller than the diameter of the charged particle beam (beam limiting apertures). Then, each of the beamlets may constitute a charged particle beam or beamlet to be influenced according to the methods disclosed herein.

In some embodiments, the electrostatic correction field is applied to compensate or pre-compensate at least one of a beam aberration caused by the electrostatic deflection field, a spherical aberration, an astigmatism, a hexapole aberration or a higher order aberration of the charged particle beam. In some embodiments, the electrostatic correction field is applied to compensate and/or pre-compensate a beam aberration caused by the electrostatic deflection field, particularly a hexapole component of the electrostatic deflection field. In some embodiments, the electrostatic correction field at least partially overlaps with the electrostatic deflection field.

Electrostatic fringe field correctors can be used for correcting spherical or other aberrations in micro-sized columns, where magnetic multipole correctors are too large.

While the foregoing is directed to embodiments of the invention, other and further embodiments of the invention may be devised without departing from the basic scope thereof, and the scope thereof is determined by the claims that follow.

The invention claimed is:

1. A multipole device for influencing a charged particle beam propagating along an optical axis, comprising:
   an electrostatic deflector with at least two deflector electrodes for deflecting the charged particle beam by a deflection angle, wherein the deflector electrodes extend over a first length along the optical axis; and
   an electrostatic corrector comprising at least four corrector electrodes to compensate for an aberration of the charged particle beam, wherein the corrector electrodes extend over a second length along the optical axis, which is shorter than the first length,
   wherein a distance between a projection of the deflector electrodes on the optical axis and a projection of the corrector electrodes on the optical axis is smaller than the first length so that, during operation of the multipole device, first fringe fields generated by the deflector electrodes and second fringe fields generated by the corrector electrodes spatially overlap, and wherein the electrostatic corrector is configured to compensate for an aberration of the charged particle beam caused by the electrostatic deflector.

2. The multipole device of claim 1, wherein a ratio between the first length and the second length (L2) is two or more, or 20 or more.

3. The multipole device of claim 1, wherein the distance between the projection of the deflector electrodes on the optical axis and the projection of the corrector electrodes on the optical axis is 5 mm or less, or wherein the deflector electrodes partially overlap with the corrector electrodes along the optical axis.

4. The multipole device of claim 1, wherein the deflector electrodes and the corrector electrodes are fixed to at least one of a common support structure and a common substrate.

5. A multipole device for influencing a charged particle beam propagating along an optical axis, comprising:
   an electrostatic deflector with at least two deflector electrodes for deflecting the charged particle beam by a deflection angle, wherein the deflector electrodes extend over a first length along the optical axis; and
   an electrostatic corrector comprising at least four corrector electrodes to compensate for an aberration of the charged particle beam, wherein the deflector electrodes extend over a second length along the optical axis, which is shorter than the first length.

6. The multipole device of claim 5, wherein a distance between a projection of the deflector electrodes on the optical axis and a projection of the corrector electrodes on the optical axis is smaller than the first length, or 5 mm or less.

7. The multipole device of claim 5, wherein a main extension direction of the deflector electrodes is parallel to the optical axis and a main extension direction of the corrector electrodes is transverse or perpendicular to the optical axis.

8. The multipole device of claim 5, wherein the electrostatic corrector is configured as at least one of a quadrupole corrector comprising four corrector electrodes, an octupole corrector comprising eight corrector electrodes, a 12-pole corrector comprising 12 corrector electrodes, a 14-pole comprising 14 corrector electrodes and a 20-pole corrector comprising 20 corrector electrodes.

9. The multipole device of claim 5, wherein the electrostatic corrector is configured to provide a correction of at least one of a beam aberration caused by the electrostatic deflector, an astigmatism of the charged particle beam, a spherical aberration of the charged particle beam, and a hexapole or a higher order aberration of the charged particle beam.

10. The multipole device of claim 5, wherein the electrostatic deflector is configured as a dipole deflector with at least one pair of arc-shaped electrodes or plate electrodes arranged on opposing sides of the charged particle beam path.

11. The multipole device of claim 5, wherein the electrostatic corrector comprises a high-resistance layer which extends at least partially around the optical axis between at least two of the corrector electrodes and is configured to allow a current flow between the at least two of the corrector electrodes.

12. The multipole device of claim 5, wherein the electrostatic corrector comprises a substrate with at least one aperture opening for the charged particle beam, wherein the corrector electrodes are formed on a first main surface of the substrate at respective angular positions around the aperture opening.

13. The multipole device of claim 12, wherein a minimum diameter of the aperture opening is smaller than a minimum distance between two of the corrector electrodes which are arranged on opposite sides of the aperture opening.

14. The multipole device of claim 12, wherein the substrate comprises a first layer made of an insulator material which comprises the first main surface of the substrate, and a second layer made of a conductor or semiconductor material which comprises a second main surface of the substrate opposite the first main surface.

15. The multipole device of claim 14, wherein the second main surface of the substrate is directed to an upstream side of the electrostatic corrector, the first main surface of the substrate on which the corrector electrodes are formed is directed to a downstream side of the electrostatic corrector, and the electrostatic deflector is arranged on the downstream side of the electrostatic corrector.

16. The multipole device of claim 5, wherein the electrostatic deflector is arranged on a downstream side of the electrostatic corrector, and a further electrostatic corrector is arranged on a downstream side of the electrostatic deflector.

17. A multipole arrangement for individually influencing at least a first beamlet of charged particles propagating along a first optical axis and a second beamlet of charged particles propagating along a second optical axis, comprising:
   a first multipole device according to claim 5 for influencing the first beamlet propagating along the first optical axis; and
   a second multipole device according to claim 5 for influencing the second beamlet propagating along the second optical axis.

18. The multipole arrangement of claim 17, wherein the corrector electrodes of the first and second multipole devices are arranged on a first main surface of a substrate with aperture openings for generating the first and second beamlets.

19. A charged particle beam device, comprising:
   a beam source for generating a charged particle beam propagating along an optical axis; and a multipole device for influencing the charged particle beam, comprising:
- an electrostatic deflector with at least two deflector electrodes for deflecting the charged particle beam by a deflection angle, wherein the deflector electrodes extend over a first length along the optical axis; and
- an electrostatic corrector comprising at least four corrector electrodes to compensate for an aberration of the charged particle beam, wherein the corrector electrodes extend over a second length along the optical axis, which is shorter than the first length.

* * * * *